United States Patent
Ishikawa

(10) Patent No.: US 7,196,347 B2
(45) Date of Patent: Mar. 27, 2007

(54) SEMICONDUCTOR LIGHT EMITTING DEVICE

(75) Inventor: Tsutomu Ishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 218 days.

(21) Appl. No.: 10/876,838

(22) Filed: Jun. 25, 2004

(65) Prior Publication Data
US 2005/0029528 A1 Feb. 10, 2005

(30) Foreign Application Priority Data
Aug. 6, 2003 (JP) .............................. 2003-206217

(51) Int. Cl.
H01L 29/06 (2006.01)
H01L 29/12 (2006.01)

(52) U.S. Cl. .......................... 257/11; 257/79

(58) Field of Classification Search ............ 257/11–12, 257/79, 194
See application file for complete search history.

(56) References Cited

U.S. PATENT DOCUMENTS 5,696,389 A * 12/1997 Ishikawa et al. ............... 257/99
6,455,870 B1 * 9/2002 Wang et al. ................... 257/12

FOREIGN PATENT DOCUMENTS

| JP | 62-119196 | 5/1987 |
|---|---|---|
| JP | 07-176788 | 7/1995 |
| JP | 08-070139 | 3/1996 |
| JP | 10-308558 | 11/1998 |
| JP | 11-163402 | 6/1999 |
| JP | 2002-170776 | 6/2002 |
| JP | 2002-170991 | 6/2002 |
| JP | 2003-101141 | 4/2003 |
| JP | 2003-115642 | 4/2003 |
| JP | 2003-204078 | 7/2003 |
| JP | 2004-112002 | 4/2004 |
| JP | 2004-281553 | 10/2004 |
| JP | 2004-336080 | 11/2004 |
| JP | 2004-343147 | 12/2004 |
| JP | 2005-051170 | 2/2005 |

OTHER PUBLICATIONS

U.S. Appl. No. 03/103062, filed Dec. 11, 2003.

* cited by examiner

*Primary Examiner*—Phat X. Cao
*Assistant Examiner*—Theresa T. Doan
(74) *Attorney, Agent, or Firm*—Hogan & Hartson LLP

(57) ABSTRACT

In a III group nitride compound semiconductor wherein light that has been emitted in a light emitting portion formative layer is reflected by a multilayered reflection layer that is provided between the light emitting portion formative layer and sapphire substrate, it is desirable, for increasing the reflection efficiency of the light that has been emitted in the light emitting portion formative layer, that the multilayered reflection layer be provided at a position that is as near to the light emitting portion as possible. However, since the multilayered reflection layer is high in resistance value and also high in power consumption, locating the multilayered reflection layer near the light emitting portion formative layer results in that the resistance value in the vicinity of a relevant cathode electrode becomes increased. This raises the problem that emission of light occurs only in part of the light emitting portion formative layer. In the semiconductor light emitting device of the present invention, a superlattice layer is provided between the light emitting portion formative layer and the cathode electrode.

2 Claims, 4 Drawing Sheets

SEMICONDUCTOR LIGHT EMITTING DEVICE

BACKGROUND OF THE INVENTION

1. Field of the Invention

The disclosure of Japanese Patent Application No. 2003-206217 filed Aug. 6, 2003 including specification, drawings and claims is incorporated herein by reference in its entirety.

The present invention relates to a semiconductor light emitting device that is comprised of a III group nitride compound semiconductor. More particularly, the invention concerns a semiconductor light emitting device comprised of a compound semiconductor, which is equipped with a multilayered reflection layer and a superlattice layer.

2. Description of the Related Art

In FIG. 1, there is illustrated a conventional semiconductor light emitting device that is comprised of a III group nitride compound semiconductor. In FIG. 1, a reference numeral 57 denotes a sapphire substrate, a reference numeral 55 denotes an n-type semiconductor layer, a reference numeral 61 denotes a multilayered reflection layer, a reference numeral 56 denotes a cathode electrode, a reference numeral 54 denotes an active layer, and a reference numeral 53 denotes a p-type semiconductor layer.

In a semiconductor light emitting device that is comprised of a III group nitride compound semiconductor that is expressed as $Al_xGa_yIn_{1-x-y}N$ (where $0 \leq x \leq 1$, $0 \leq y \leq 1$, and $0 \leq x+y \leq 1$), a semiconductor substrate that composes a base of it is unable to be manufactured using bulk crystal that is good in quality and large in size. Therefore, ordinarily, the semiconductor substrate is manufactured by causing a III group nitride compound semiconductor to be crystal-grown onto an insulating substrate consisting of sapphire. And, with respect to over this semiconductor substrate, various kinds of process steps are executed to thereby manufacture the device (for example, refer to Japanese Patent Application Laid-Open No. S62-119196). Therefore, the semiconductor light emitting device has been developed (for example, refers to Japanese Patent Application Laid-Open No. H7-176788) in such a way that the light that has been emitted in the active layer 54 is ordinarily taken out from the side of the p-type semiconductor layer 53; the multilayered reflection layer 61 is provided between the active layer 54 and the sapphire substrate 57 to increase this efficiency of taking out; the light emitted in the active layer 54 is reflected by the multilayered reflection layer 61; and the light is taken out from the side of the p-type semiconductor layer 53.

In this semiconductor light emitting device, it is desirable, that the reflector layer 61 be provided at a side that is as lower than the cathode electrode 56, as possible, namely at a position that is as close to the side of the sapphire substrate 57 as possible, because the multilayered reflection layer 61 is high in resistance value and is also high in power consumption per unit amount of electric current. On the other hand, in order to enhance the reflection efficiency of the light emitted in the active layer 54, it is desirable that the multilayered reflection layer 61 be provided at a position that is as close, to the active layer 54, as possible.

However, if the multilayered reflection layer 61 that is located at a stage that is lower from the cathode electrode 56 is made to come near to the active layer 54 and thereby the distance between the multilayered reflection layer 61 and the cathode electrode 56 shortens, the resistance value near the cathode electrode 56 becomes high with the result that the power consumption per unit amount of electric current of the semiconductor light emitting device increases. Also, electrons that are supplied from the cathode electrode 56 are supplied to a biased region of the active layer 54, raising the problem that luminescence occurs only in part of the active layer 54. On the contrary, if the multilayered reflection layer 61 is lowered and thereby the distance that has been measured with respect to the active layer 54 increases, the problem arises that the light emitted in the active layer 54 is not effectively reflected by the multilayered reflection layer 61.

SUMMARY OF THE INVENTION

The present invention, in order to solve the above-described problems, has an object to provide a semiconductor light emitting device that enables making small the power consumption and enables uniformly causing light to be emitted in a light emitting portion included in the light emitting portion formative layer.

To attain the above object, according to a first aspect of the invention of this application, there is provided a semiconductor light emitting device that is comprised of a III group nitride compound semiconductor that is expressed as $Al_xGa_yIn_{1-x-y}N$ (where $0 \leq x \leq 1$, $0 \leq y \leq 1$, and $0 \leq x+y \leq 1$), which comprises, at least, a substrate, a multilayered reflection layer formed on the substrate, a superlattice layer formed on the multilayered reflection layer, and a light emitting portion formative layer that sequentially includes at least a second conductivity type semiconductor layer and first conductivity type semiconductor layer, that are formed on the superlattice layer, in the order mentioned, wherein a first electrode is electrically connected to the first conductivity type semiconductor layer that consists of an n-type or p-type semiconductor, and a second electrode is electrically connected to the second conductivity type semiconductor layer that consists of an n-type or p-type semiconductor having a polarity opposite to that of the first conductivity type semiconductor layer or superlattice layer.

According to the invention of this application, the semiconductor light emitting device comprises a region that is exposed to outside the device, on at least one of the second conductivity type semiconductor layer and superlattice layer, and enables the second electrode to be disposed on that region that is exposed.

DESCRIPTION OF THE PREFERRED EMBODIMENTS

Figure 1:
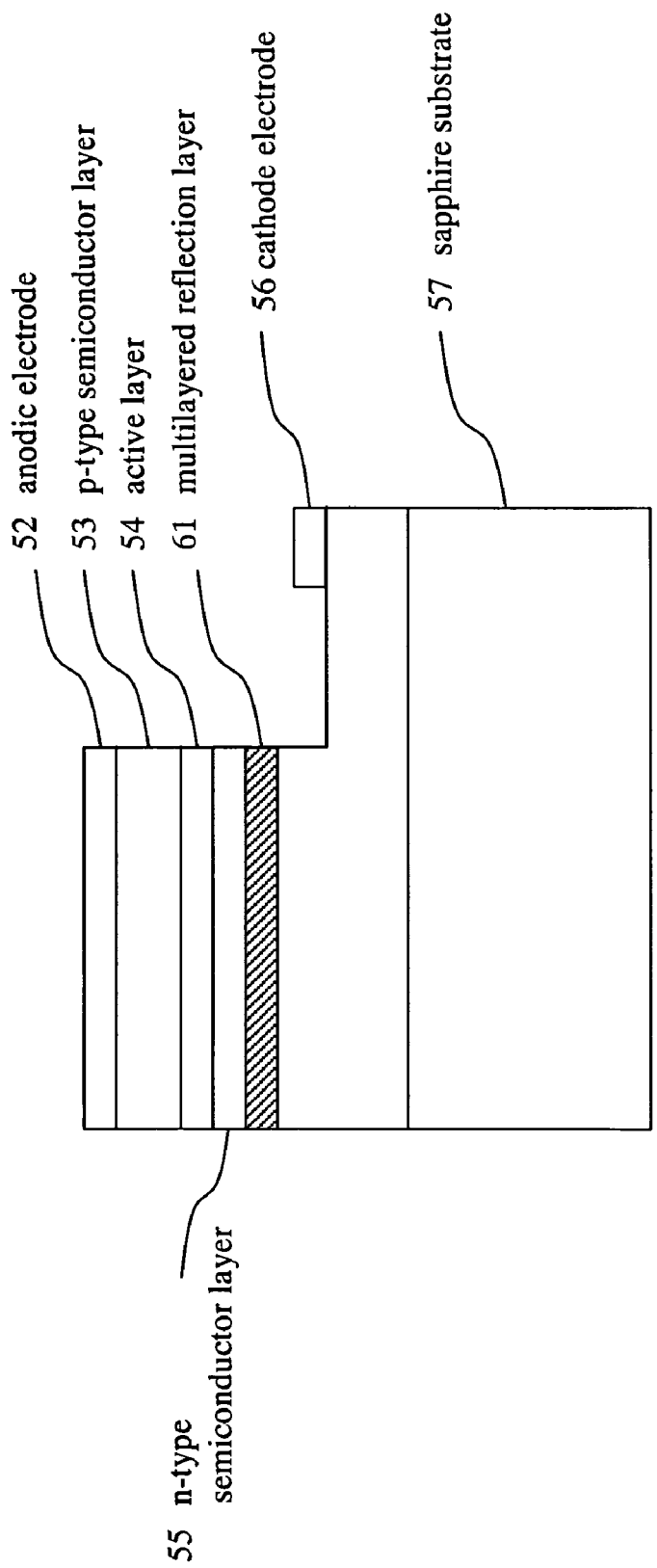
FIG. 1 illustrates a conventional semiconductor light emitting device that is comprised of a III group nitride compound semiconductor.
Figure 2:
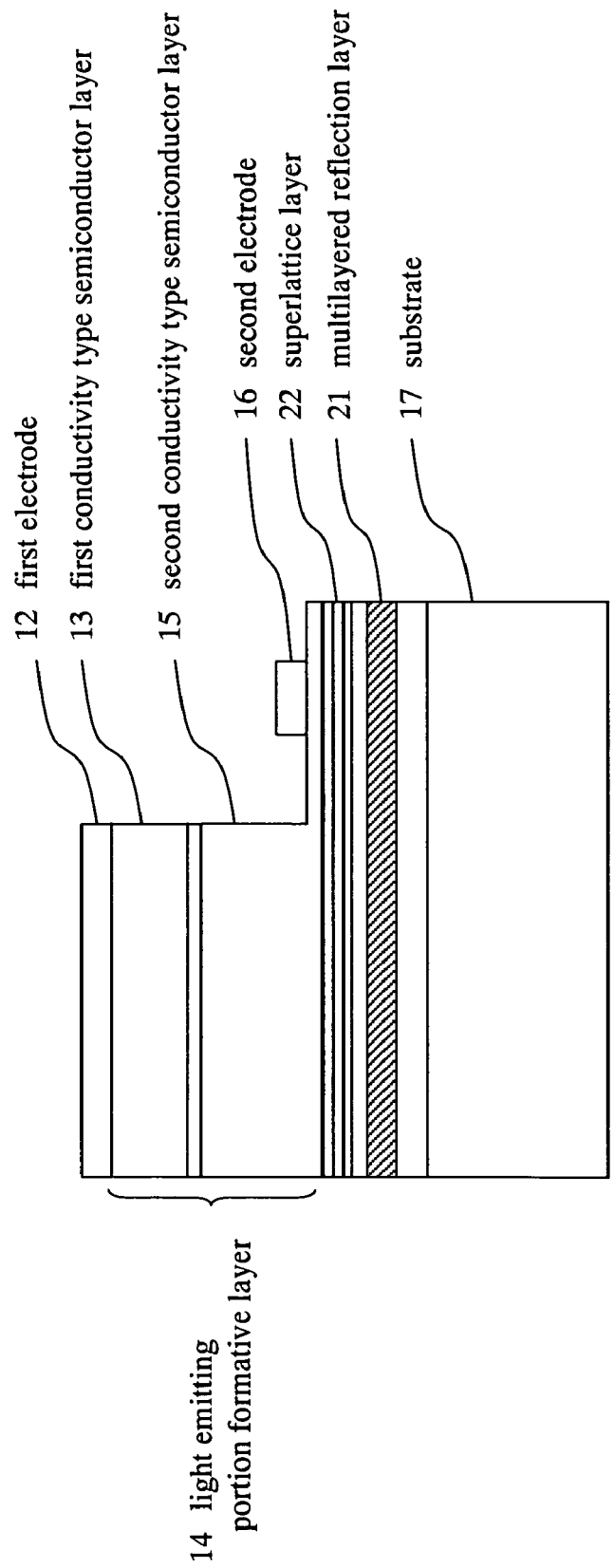
FIG. 2 is a view illustrating an example of an embodiment of the invention of this application.
Figure 3:
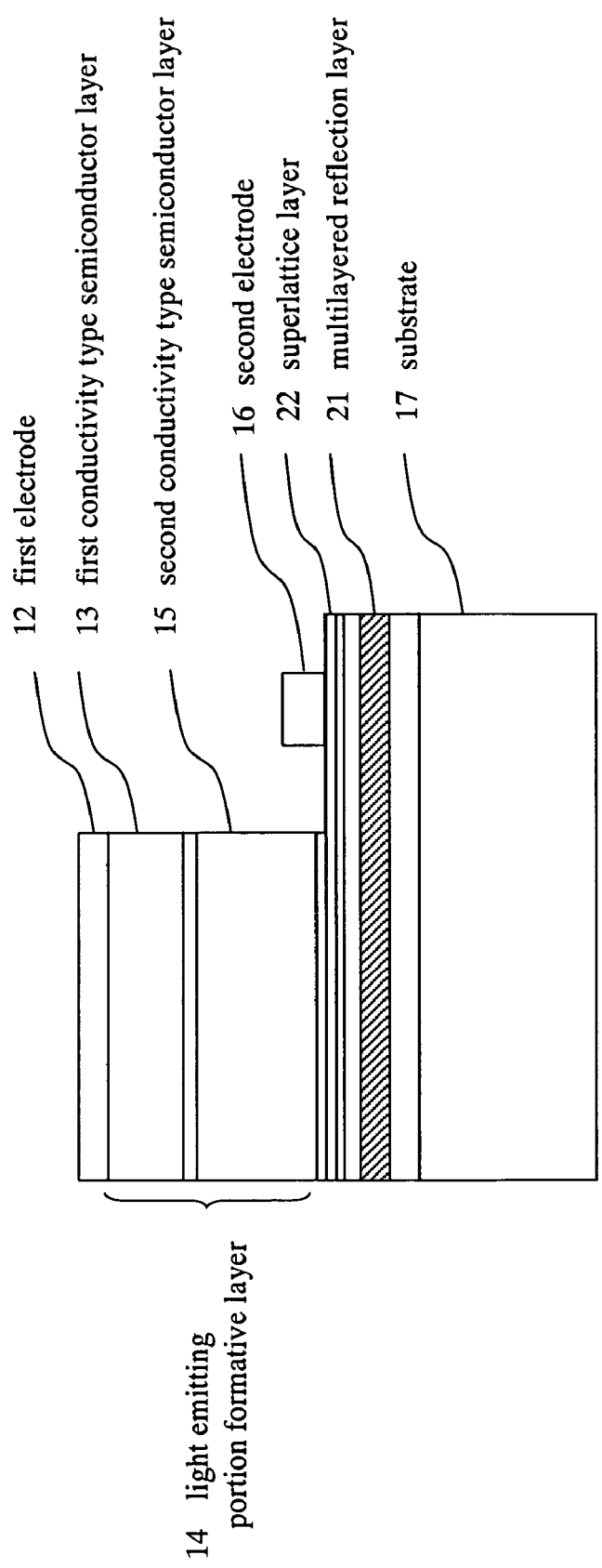
FIG. 3 is a view illustrating another example of the embodiment of the invention of this application.

Hereinafter, an embodiment of the invention of this application will be explained using FIGS. 2 and 3. FIGS. 2 and 3 are views illustrating examples of the embodiment of the invention of this application. In FIGS. 2 and 3, a reference numeral 12 denotes a first electrode, a reference numeral 13 denotes a first conductivity type semiconductor layer, a reference numeral 15 denotes a second conductivity type semiconductor layer, a reference numeral 14 denotes a light emitting portion formative layer, a reference numeral 16 denotes a second electrode, a reference numeral 17 denotes a substrate, a reference numeral 21 denotes a multilayered reflection layer, and a reference numeral 22 denotes a superlattice layer. It is to be noted that this embodiment is only illustrative of the invention of this application and the invention of this application permits various changes and modifications to be made without impairing the subject matter of the invention, and the invention of this application is not limited to that embodiment.

This embodiment has a characterizing feature in that it provides a semiconductor light emitting device that is comprised of a III group nitride compound semiconductor that is expressed as $Al_xGa_yIn_{1-x-y}N$ (where $0 \leq x \leq 1$, $0 \leq y \leq 1$, and $0 \leq x+y \leq 1$), which comprises a substrate 17, a multilayered reflection layer 21 formed on the substrate 17, a superlattice layer 22 formed on the multilayered reflection layer 21, and a light emitting portion formative layer 14 that sequentially includes at least a second conductivity type semiconductor layer 15 and first conductivity type semiconductor layer 13, that are formed on the superlattice layer 22, in the order mentioned, wherein a first electrode 12 is electrically connected to the first conductivity type semiconductor layer 13 that consists of an n-type or p-type semiconductor, and a second electrode 16 is electrically connected to the second conductivity type semiconductor layer 15 that consists of an n-type or p-type semiconductor having a polarity opposite to that of the first conductivity type semiconductor layer 13 or superlattice layer 22.

In a case where using the multilayered reflection layer 21 as one element of the semiconductor light emitting device, in order to mitigate the effect of the resistance value of the multilayered reflection layer 21 upon the semiconductor light emitting device and decrease the power consumption per unit amount of electric current of the semiconductor light emitting device, it is better to dispose the multilayered reflection layer 21 at a position that is on the downside of the second electrode 16. On the other hand, if the distance between the light emitting portion formative layer 14 and the multilayered reflection layer 21 increases, the light that has been emitted in the light emitting portion formative layer 14 is not efficiently reflected by the multilayered reflection layer 21. For this reason, it is preferable that the multilayered reflection layer 21 be located at a position that is on the downside from the second electrode 16 and that is as close to the second electrode 16 as possible.

However, if the second electrode 16 is approached to the multilayered reflection layer 21, the resistance value between the second electrode 16 and the multilayered reflection layer 21 increases. This inconveniently results in increased power consumption per unit amount of electric current of the semiconductor light emitting device. Also, since electrons, from the second electrode 16 up to the light emitting portion formative layer 14, pass through avoiding portions the gradient of whose resistance value is steep, electric current is supplied to the light emitting portion formative layer 14 in such a way that it is biased thereto. As a result of this, the problem arises that luminescence occurs only in a part of a light emitting portion included in the light emitting portion formative layer 14. For solving this problem, in this embodiment, the superlattice layer 22 is provided between the light emitting portion formative layer 14 and the multilayered reflection layer 21, as illustrated in FIG. 2. And, by providing the second electrode 16 on the second conductivity type semiconductor layer 15 or super-lattice layer 22, this embodiment enables lowering the resistance value between the second electrode 16 and light emitting portion formative layer 14.

Here, the wording "multilayered reflection layer" refers to a multilayered layer wherein a layer that is low in index of refraction and that is comprised of a nitride-based compound semiconductor that is expressed as $Al_xGa_yIn_{1-x-y}N$ and a layer that is high in index of refraction and that is similarly comprised of that compound are alternately laminated so as for that layer to have a high reflectance. This multi-layer layer is what is generally called "Distributed Bragg Reflector (DBR)". The thickness of each layer of the multilayered reflection layer is determined according to the wavelength of the light that is emitted in the active layer and is determined by $\lambda/(4n)$ (provided $\lambda$ represents the wavelength of the light emitted in the active layer and n represents the index of refraction of each layer of the multilayered reflection layer.). Also, the composition ratio between two of the Al, Ga, and In enables changing the index of refraction of each layer of the multilayered reflection layer and it is possible to form a multilayered reflection layer having various values of reflectance by making the nitride-based compound have a desired elemental composition as necessary.

In the example illustrated in FIG. 2, it is assumed that the multilayered reflection layer 21 that is comprised of GaN and AlGaN be formed in such a way as to contact with the substrate 17. However, the multilayered reflection layer 21 is not limited to that composition and, further, it is not needed that the layer 21 be formed in such a way as it has a direct contact with the substrate 17. Specifically, there may exist a buffer layer between the substrate 17 and the multilayered reflection layer 21 or a layer that functions otherwise. For example, as the buffer layer, various kinds of layers such as GaN or AlN, which is grown at a low temperature can be thought available. Incidentally, since the multilayered reflection layer 21 is not used as the electric-current passage, the layer 21 may be of either a first conductivity type or a second conductivity type.

Also, the term "superlattice" refers to a lattice structure that is formed in such a way that, in general, a crystal lattice having a certain length of period is a subject to modulation by the periodic structure that is again larger in length of period than that of that crystal lattice. In the invention of this application, the superlattice layer 22 is based using a layer that consists of, among the general superlattices, the one that has a structure wherein two layers made of materials the forbidden bandwidths of that are relatively large in terms of the difference between them are alternately laminated together. In the layer narrow in forbidden band width and layer wide in forbidden band width, which compose the superlattice layer 22, electrons or holes are in a state of being confined.

In this embodiment, the thickness of the layer narrow in forbidden band width and layer wide in forbidden band width, which compose the superlattice layer 22, is made the de Broglie wavelength, or so, of the electrons or holes, thereby limiting the movement of the electrons or holes in the direction that is vertical to the layer narrow in forbidden band width and layer wide in forbidden band width. Further, by making free the movement of the electrons or holes made in the direction that is parallel to the layer narrow in forbidden band width and layer wide in forbidden band width, it becomes possible to have electrons or holes uniformly dispersed in those layers. In other words, in the semiconductor light emitting device according to this embodiment, the superlattice layer 22 has the role of causing the flow of electric current, which has been injected from the second electrode 16, in a direction that is transverse. Therefore, supplying the electric current to the light emitting portion formative layer 14 is uniformly performed. Consequently, the light emitting portion that is included in the light emitting portion formative layer 14 can be uniformly made to emit light. In addition, because electrons or holes can be diffused into the interior of the superlattice layer 22, the resistance value of the superlattice layer 22 becomes necessarily small and therefore it is possible to make small the power consumption per unit amount of electric current.

Incidentally, since the invention of this application is a semiconductor light emitting device that is comprised of a III group nitride compound semiconductor that is expressed as $Al_xGa_yIn_{1-x-y}N$ (where $0 \leq x \leq 1$, $0 \leq y \leq 1$, and $0 \leq x+y \leq 1$), it is possible to use, as the superlattice layer 22, the one that has been prepared by laminating multiple layers each of that is comprised of a nitride compound semiconductor that is expressed as $Al_xGa_yIn_{1-x-y}N$. Also, in each layer of this superlattice layer 22, it is necessary that it have a thickness that is a critical thickness of approximately 10 nm or less that can resist distortions. By laminating each layer with its thickness being that critical one or less, distortions are mitigated, crystal defects are decreased and the layer that is laminated on the superlattice layer 22 also becomes good in quality.

Also, although the superlattice layer 22 is comprised of layers that have the same polarity as the second conductivity type semiconductor layer 15, doping is not always needed. Namely, since the nitride compound semiconductor that is expressed as $Al_xGa_yIn_{1-x-y}N$ (where $0 \leq x \leq 1$, $0 \leq y \leq 1$, and $0 \leq x+y \leq 1$) becomes an n-type one unless doping is performed with respect thereto, in a case where making the superlattice 22 an n-type, n-type dopant may be doped, or may not be doped.

Also, in this embodiment, it is not necessary that the superlattice layer 22 be formed in such a way as to have a direct contact with the multilayered reflection layer 21. Specifically, there may exist a buffer layer between the multilayered reflection layer 21 and the superlattice layer 22 or a layer that functions otherwise. For example, as the buffer layer, various kinds of layers such as a layer comprised of GaN, which is grown at a high temperature can be thought available.

Also, in this embodiment, as illustrated in FIG. 3, a portion where part of the superlattice layer 22 is exposed to outside the device may be formed there and it may be arranged that the superlattice layer 22 function as a contact layer so that that portion may have a direct contact with the second electrode 16. In this case, since no layer exists, whatsoever, between the second electrode 16 and superlattice layer 22, it becomes possible to shorten the distance up to the electric current reaching the light emitting portion formative layer 14. Simultaneously, it results that the multilayered reflection layer 21 can be located the closest to the light emitting portion formative layer 14. This enables increasing the reflection efficiency of light that has been emitted in the light emitting portion formative layer 14.

Also, in this embodiment, it is preferable, in the respect of enhancing the light emitting efficiency, that the light emitting portion formative layer 14 be comprised of a nitride compound semiconductor that is expressed as $Al_xGa_yIn_{1-x-y}N$ (where $0 \leq x \leq 1$, $0 \leq y \leq 1$, and $0 \leq x+y \leq 1$); the layer 14 be formed on the superlattice layer 22; the layer 14 be the one that is equipped with at least the second conductivity type semiconductor layer 15 and the first conductivity type semiconductor layer 13 sequentially in this order; the layer 14 be equipped with the active layer between the second conductivity type semiconductor layer 15 and the first conductivity type semiconductor layer 13; and the type of its junction is made a double-hetero junction. It still falls within the scope of an invention even if the light emitting portion formative layer 14 is comprised of no active layer.

Also, the active layer may be formed as having a structure that is given in kind such as a bulk structure, a single quantum well structure or a multi-quantum well structure. The active layer may also be formed as having a structure of bulk crystal that comprised of the material of that is expressed as $In_{1-y}Ga_yN$ (where $0 \leq y \leq 1$). In a case where adopting a single quantum well structure or multi-quantum well structure, it results that there are used a layer that is small in band gap as the well layer and a layer that is large in band gap as the barrier layer. For example, there can be used a layer that comprised of material expressed as $In_{1-y}Ga_yN$ (where $0 \leq y \leq 1$) as the well layer and a layer that comprised of material expressed as $Al_xGa_yN$ (where $x+y=1$) as the barrier layer.

Also, in this embodiment, the second conductivity type semiconductor layer 15 is comprised of an n-type or p-type nitride compound semiconductor that is expressed as $Al_xGa_yIn_{1-x-y}N$ (where $0 \leq x \leq 1$, $0 \leq y \leq 1$, and $0 \leq x+y \leq 1$) and may be of a single-layer structure or multi-layer structure. In the present invention, the superlattice layer 22 is sandwiched between the second conductivity type semiconductor layer 15 and multilayered reflection layer 21 and the invention thereby utilizes the easiness with which electric current flows in a lateral direction that in the superlattice layer 21. Therefore, the thickness of the second conductivity type semiconductor layer 15 can be made thinner than that in the prior art. Although in the example of FIG. 2 it is assumed that the second conductivity type semiconductor layer 15 be a single layer that comprised of an n-type or p-type GaN material that functions both as a cladding layer and as contact layer that makes ohmic contact with the second electrode 16, the cladding layer and contact layer may be formed respectively separately. Further, the second conductivity type semiconductor layer 15 may have a layer that has other function, such as a hole or electron barrier layer, in conformity with the polarity of the second conductivity type semiconductor layer 15.

Also, in this embodiment, the first conductivity type semiconductor layer 13 is a layer that has a polarity opposite to that of the second conductivity type semiconductor layer 15 and is comprised of a nitride compound semiconductor that is expressed as $Al_xGa_yIn_{1-x-y}N$ (where $0 \leq x \leq 1$, $0 \leq y \leq 1$, and $0 \leq x+y \leq 1$), and may consist of a single layer or multiple layers. The thickness of it, also, is suitably adjusted as necessary. For example, the first conductivity type semiconductor layer 13 may be made up into a double-layer structure that is comprised of an $Al_xGa_yN$ (where $x+y=1$) cladding layer having a polarity opposite to that of the second conductivity type semiconductor layer 15 and a GaN contact layer having a polarity opposite to that of the second conductivity type semiconductor layer 15. Alternatively, the first conductivity type semiconductor layer 13 may be a single layer that exhibits both functions of a contact layer and cladding layer or, alternatively, the layer 13 may be a layer that has a superlattice structure. Further, the layer 13 may have a layer that has other function, such as a hole or electron barrier layer, in conformity with the polarity of the first conductivity type semiconductor layer 13.

Also, in this embodiment, regarding the first electrode 12, it may be made of any material only if it is electrically connected to the first conductivity type semiconductor layer 13 and can be brought into ohmic contact with the first conductivity type semiconductor layer 13. In a case where the first conductivity type semiconductor layer 13 is an n-type one, it is preferable that the first electrode 12 be the one that is comprised of Ti/Al or the like. In a case where the first conductivity type semiconductor layer 13 is a p-type one, even if using any one of Ni/Au, ZnO, ITO and the like as the first electrode 12, the resulting layer becomes transparent or almost transparent with respect to the light that is emitted in the light emitting portion formative layer 14.

Also, in this embodiment, regarding the second electrode 16, it may be made of any material only if it is electrically connected to the second conductivity type semiconductor layer 15 and can be brought into ohmic contact with the second conductivity type semiconductor layer 15. Preferably, the second electrode 16 is disposed on that region of at least one of the second conductivity type semiconductor layer 15 and superlattice layer 22 which is exposed to outside the device. For example, in a case where the second conductivity type semiconductor layer 15 is an n-type one, the second electrode 16 may be the one that is comprised of Ti/Al or the like. And, in a case where the second conductivity type semiconductor layer 15 is a p-type one, the second electrode 16 may be the one that is comprised of Ni/Au, ZnO, ITO and the like. Incidentally, it is preferable that, as illustrated in FIG. 2, part of the second conductivity type semiconductor layer 15 be exposed and the second electrode 16 be formed on that exposed portion. This is because the manufacturing method involved is made easy. Namely, since it can be formed only by executing the photolithography, etching process steps and the like after forming all relevant layers, adopting this structure is preferable. The exposed portion is not limited to that position which is illustrated in FIG. 2. Needless to say, it would be sufficient if that exposed portion is provided at a position at which it is electrically connected to the second electrode 16 and which enables exhibiting the effect of the invention of this application.

Also, in this embodiment, it is preferable, in the sense of decreasing the ineffective electric current, that the substrate 17 be the one that consists of an insulative substrate or first conductivity type substrate. The reason for this is as follows. In a case where the substrate 17 consists of a second conductivity type one, the electric current that has been injected from the second electrode 16 does not only flow toward the light emitting portion formative layer 14 but also flows toward the side of the substrate 17. And, this electric current that has flown toward the side of the substrate 17 becomes an ineffective electric current. Accordingly, as the substrate 17, the one that is made of sapphire, SiC, GaN, or the like is available if it satisfies the above-described requirements. Also, in a case where using a sapphire substrate as the substrate 17, the principal surface thereof may be a C, R, or A surface.

Figure 4:
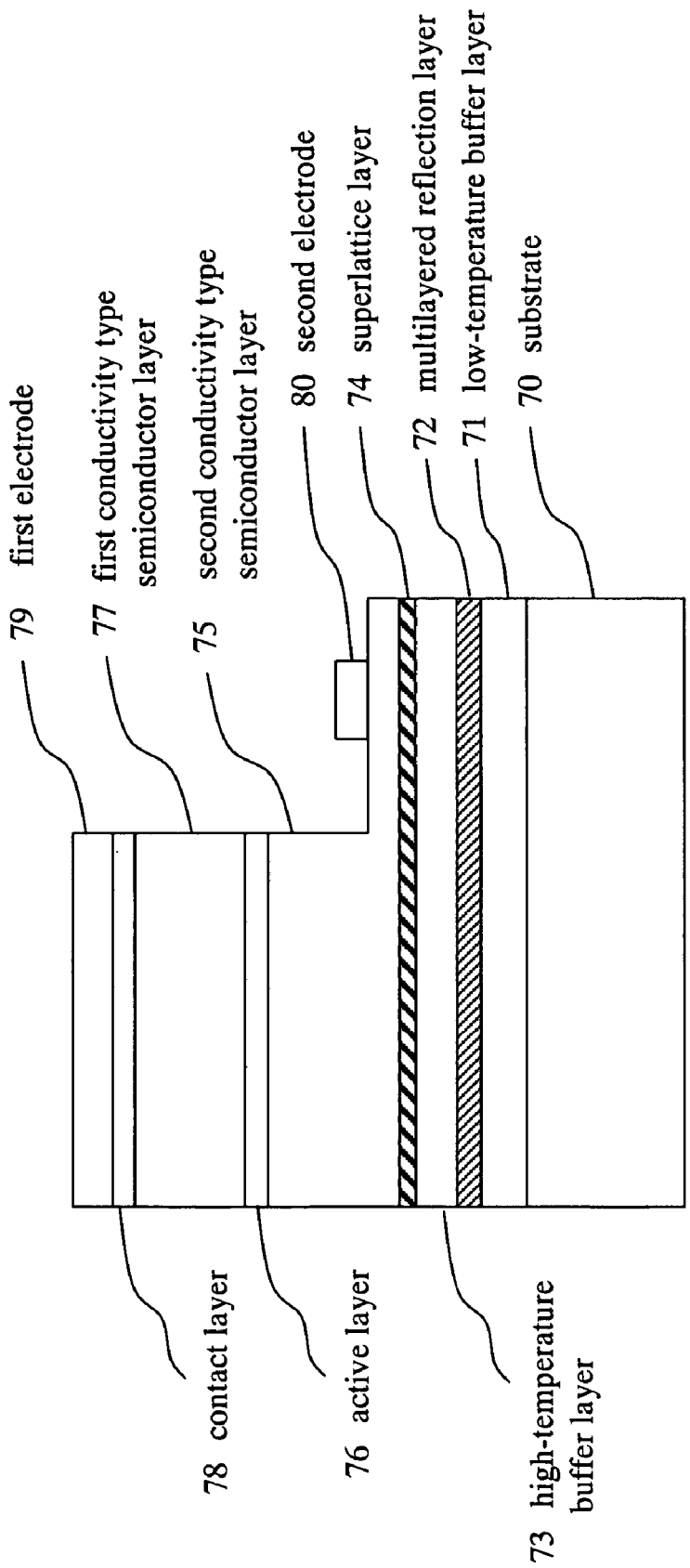
FIG. 4 is a view illustrating the embodiment of the invention of this application.

Hereinafter, a concrete example of this embodiment will be explained with reference to FIG. 4. In FIG. 4, a reference numeral 70 denotes a substrate, a reference numeral 71 denotes a low-temperature buffer layer, a reference numeral 72 denotes a multilayered reflection layer, a reference numeral 73 denotes a high-temperature buffer layer, a reference numeral 74 denotes a superlattice layer, a reference numeral 75 denotes a second conductivity type semiconductor layer, a reference numeral 76 denotes an active layer, a reference numeral 77 denotes a first conductivity type semiconductor layer, a reference numeral 78 denotes a contact layer, a reference numeral 79 denotes a first electrode, and a reference numeral 80 denotes a second electrode.

First, on the substrate 70 that is comprised of sapphire, there is formed the low-temperature buffer layer 71 that is comprised of an n-type GaN or the like and the thickness of that is approximately 0.01 to 0.2 µm or so, at a relatively low temperature using TMG, TMA, TMI, and $NH_3$ as raw material by using an MOCVD technique. Subsequently, there is formed the multilayered reflection layer 72, which is composed of 10 pairs of layers that make 20 layers in total. Each of the layers is comprised of an n-type $In_{1-y}Ga_yN$ (for example x=0 and y=0.98), and an n-type AlGaN (for example x=0.2 and y=0.8) and has the thickness of about 40 nm. Thereafter, there is formed the high-temperature buffer layer 73 that is comprised of an n-type GaN the thickness of that is approximately 0.01 to 1 µm, at a high temperature of approximately 700 to 1200° C. Subsequently, there are formed 10 pairs of layers that make 20 layers in total, such that each of the layers has the thickness of approximately 2 nm and is comprised of a n-type GaN and n-type $In_yGa_{1-y}N$ (for example y=0.02), respectively, which compose the superlattice layer 74. Thereafter, there is formed the second conductivity type semiconductor layer 75 that is comprised of an n-type GaN and the thickness of that is approximately 0.1 to 5 µm.

Next, the active layer 76 that is comprised of a non-doped, an n-type or a p-type $In_yGa_{1-y}N$ (for example y=0.06) material is formed to a thickness of approximately 0.05 to 0.1 µm. Subsequently, a p-type AlGaN (for example z=0.15) layer that is the first conductivity type semiconductor layer 77 is formed to a thickness of approximately 0.01 to 0.3 µm. Further the contact layer 78 that is comprised of a p-type GaN material is formed to a thickness of approximately 0.3 to 2 µm.

For making the above-described second conductivity type semiconductor layer 75 a n-type one, impurity raw material gases such as $SiH_4$, $GeH_4$ and $TeH_4Si$, in which Si, Ge and Te are synthesized, are mixed into the relevant reaction gas. In the case of an n-type one, however, its nature may be utilized to that end, since nitrogen is easy to evaporate and the material naturally becomes an n-type one when performing film formation without mixing impurities in.

After that, a protective film such as $SiO_2$ or $Si_3N_4$ is provided over the entire surface of the grown film of the semiconductor layer, and approximately 20 to 60 minutes of annealing is performed at 400 to 800° C. to thereby perform activation with respect to the first conductivity type semiconductor layer 77 that is of a p-type. It is to be noted that annealing may be performed without providing a protective film.

After completion of the annealing, a mask such as a resist film is provided, and the laminated semiconductor layers are etched until the second conductivity type semiconductor layer 75 becomes exposed. This etching is performed, in an atmosphere of a mixed gas of, for example, $Cl_2$ and $BCl_3$, through reactive ion etching.

Subsequently, as the first electrode 79 and second electrode 80, a metal film such as Ti, Au or Al is formed using sputtering or deposition process. As a final step, lapping is performed with respect to the substrate 70, which then is dicing performed into respective chips, whereby a semiconductor light emitting device is formed.

As has been explained above, in the semiconductor light emitting device according to the present invention, diffusing holes or electrons into the superlattice layer has become possible to perform, and decreasing the power consumption while causing uniform emission of light in the light emitting portion included in the light emitting portion formative layer, has become possible to perform.

What is claimed is:

1. A semiconductor light emitting device that is comprised of a III group nitride compound semiconductor that is expressed as $Al_xGa_yIn_{1-x-y}N$ (where $0 \leq x \leq 1$, $0 \leq y \leq 1$, and $0 \leq x+y \leq 1$), comprising:

at least, a substrate, a multilayered reflection layer formed on the substrate, a superlattice layer formed on the multilayered reflection layer, and a light emitting portion formative layer that sequentially includes at least a second conductivity type semiconductor layer and first conductivity type semiconductor layer, that are formed on the superlattice layer, in the order mentioned, wherein a first electrode is electrically connected to the first conductivity type semiconductor layer that consists of a n-type or p-type semiconductor, and a second electrode is electrically connected to the second conductivity type semiconductor layer that consists of a n-type or p-type semiconductor having a polarity opposite to that of the first conductivity type semiconductor layer, or the superlattice layer.

2. The semiconductor light emitting device according to claim 1, further comprising a region that is exposed to outside the device, on at least one of the second conductivity type semiconductor layer and superlattice layer, wherein the second electrode is disposed on the region that is exposed.

* * * * *